United States Patent
Wada et al.

(10) Patent No.: US 9,647,081 B2
(45) Date of Patent: May 9, 2017

(54) METHOD FOR MANUFACTURING SILICON CARBIDE SEMICONDUCTOR DEVICE

(71) Applicant: Sumitomo Electric Industries, Ltd., Osaka-shi (JP)

(72) Inventors: Keiji Wada, Osaka (JP); Takeyoshi Masuda, Osaka (JP); Mitsuhiko Sakai, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/913,217

(22) PCT Filed: Jul. 9, 2014

(86) PCT No.: PCT/JP2014/068286
§ 371 (c)(1),
(2) Date: Feb. 19, 2016

(87) PCT Pub. No.: WO2015/025632
PCT Pub. Date: Feb. 26, 2015

(65) Prior Publication Data
US 2016/0204220 A1    Jul. 14, 2016

(30) Foreign Application Priority Data

Aug. 21, 2013    (JP) .................................. 2013-171374

(51) Int. Cl.
*H01L 29/66* (2006.01)
*H01L 21/02* (2006.01)
(Continued)

(52) U.S. Cl.
CPC .. *H01L 29/66068* (2013.01); *H01L 21/02164* (2013.01); *H01L 21/0475* (2013.01);
(Continued)

(58) Field of Classification Search
CPC .................................................. H01L 21/0445
See application file for complete search history.

(56) References Cited

U.S. PATENT DOCUMENTS

| | | | | |
|---|---|---|---|---|
| 4,865,685 A * | 9/1989 | Palmour | ............. | H01L 21/0475 204/192.37 |
| 6,767,825 B1 * | 7/2004 | Wu | ................... | H01L 21/31116 257/E21.252 |

(Continued)

FOREIGN PATENT DOCUMENTS

| | | |
|---|---|---|
| JP | H09-167744 A | 6/1997 |
| JP | 2006-156926 A | 6/2006 |

(Continued)

OTHER PUBLICATIONS

International Search Report in PCT International Application No. PCT/JP2014/068286, dated Oct. 14, 2014.
(Continued)

*Primary Examiner* — Mohammad Choudhry
(74) *Attorney, Agent, or Firm* — Venable LLP; Michael A. Sartori; F. Brock Riggs

(57) ABSTRACT

A method for manufacturing a silicon carbide semiconductor device includes steps of preparing a silicon carbide substrate having a first main surface and a second main surface opposite to the first main surface, forming a groove portion in the first main surface of the silicon carbide substrate, and cutting the silicon carbide substrate at the groove portion. The step of forming the groove portion includes a step of thermally etching the silicon carbide substrate using chlorine. Thereby, a method for manufacturing a silicon carbide semiconductor device capable of suppressing damage to a chip is provided.

9 Claims, 11 Drawing Sheets

(51) Int. Cl.
  H01L 21/04 (2006.01)
  H01L 21/324 (2006.01)
  H01L 21/78 (2006.01)
  H01L 21/3065 (2006.01)
  H01L 29/861 (2006.01)
  H01L 29/16 (2006.01)
  H01L 29/423 (2006.01)
  H01L 29/739 (2006.01)
  H01L 29/78 (2006.01)
  H01L 29/06 (2006.01)

(52) U.S. Cl.
  CPC ........ H01L 21/3065 (2013.01); H01L 21/324 (2013.01); H01L 21/78 (2013.01); H01L 29/0661 (2013.01); H01L 29/1608 (2013.01); H01L 29/4236 (2013.01); H01L 29/7397 (2013.01); H01L 29/7813 (2013.01); H01L 29/861 (2013.01)

(56) References Cited

U.S. PATENT DOCUMENTS

| | | |
|---|---|---|
| 2006/0038206 A1 | 2/2006 | Shimoyama et al. |
| 2007/0281462 A1 | 12/2007 | Kawada |
| 2008/0070380 A1 | 3/2008 | Kusunoki |
| 2010/0120237 A1 | 5/2010 | Tanaka et al. |
| 2010/0233835 A1 | 9/2010 | Kusunoki |
| 2012/0161154 A1* | 6/2012 | Mimura .............. H01L 29/4236 257/77 |
| 2013/0062629 A1 | 3/2013 | Hiyoshi et al. |
| 2013/0183820 A1 | 7/2013 | Hiyoshi et al. |

FOREIGN PATENT DOCUMENTS

| | | |
|---|---|---|
| JP | 2007-324503 A | 12/2007 |
| JP | 2010-114373 A | 5/2010 |
| JP | 2011-077418 A | 4/2011 |
| JP | 2011-082546 A | 4/2011 |
| JP | 2013-062392 A | 4/2013 |
| JP | 2013-143523 A | 7/2013 |

OTHER PUBLICATIONS

Decision to Grant Patent in counterpart Japanese Patent Application No. 2013-171374, dated Oct. 4, 2016.

* cited by examiner

METHOD FOR MANUFACTURING SILICON CARBIDE SEMICONDUCTOR DEVICE

TECHNICAL FIELD

The present invention relates to a method for manufacturing a silicon carbide semiconductor device, and in particular to a method for manufacturing a silicon carbide semiconductor device including a step of cutting a silicon carbide substrate.

BACKGROUND ART

In recent years, in order to achieve high breakdown voltage and low loss of semiconductor devices, use thereof in a high temperature environment, and the like, silicon carbide has begun to be adopted as a material for semiconductor devices. Silicon carbide is a wide band gap semiconductor having a band gap larger than that of silicon, which has been conventionally widely used as a material for semiconductor devices. Hence, by adopting silicon carbide as a material for a semiconductor device, the semiconductor device can have a high breakdown voltage, reduced on-resistance, and the like. Further, the semiconductor device adopting silicon carbide as its material also has an advantage that its characteristics are less likely to be deteriorated when it is used in the high temperature environment, when compared with a semiconductor device adopting silicon as its material.

For example, Japanese Patent Laying-Open No. 2011-82546 (PTD 1) describes a method for dividing a wafer made of a gallium nitride-based compound semiconductor or the like. According to the method for dividing the compound semiconductor wafer, first, a groove portion is formed in a compound semiconductor layer in a separation zone, and thereafter a division groove is formed by a laser method. Next, the compound semiconductor wafer is immersed in a chemical solution of an acid such as phosphoric acid, nitric acid, or hydrochloric acid, and thereby contamination on the periphery of the division groove is removed by wet etching.

CITATION LIST

Patent Document

PTD 1: Japanese Patent Laying-Open No. 2011-82546

SUMMARY OF INVENTION

Technical Problem

However, silicon carbide is stable to an acid chemical solution and has a high material hardness, when compared with other semiconductor materials. Accordingly, when a groove portion is formed in a surface of a silicon carbide substrate for example by dry etching such as ME (Reactive Ion Etching), damage may occur in a wall surface forming the groove portion, and a variation in shape may occur in the wall surface. Therefore, when the silicon carbide substrate is cut along the groove portion, damage such as a crack may extend, starting from the above damage, variation in shape, and the like, to the region of a chip in which a semiconductor element is formed. Further, damage such as chipping may occur in the chip.

The present invention has been made to solve the problem as described above, and one object of the present invention is to provide a method for manufacturing a silicon carbide semiconductor device capable of suppressing damage to a chip.

Solution to Problem

A method for manufacturing a silicon carbide semiconductor device in accordance with the present invention includes steps of preparing a silicon carbide substrate having a first main surface and a second main surface opposite to the first main surface, forming a groove portion in the first main surface of the silicon carbide substrate, and cutting the silicon carbide substrate at the groove portion. The step of forming the groove portion includes a step of thermally etching the silicon carbide substrate using chlorine.

Advantageous Effects of Invention

According to the present invention, a method for manufacturing a silicon carbide semiconductor device capable of suppressing damage to a chip can be provided.

DESCRIPTION OF EMBODIMENTS

Figure 1:
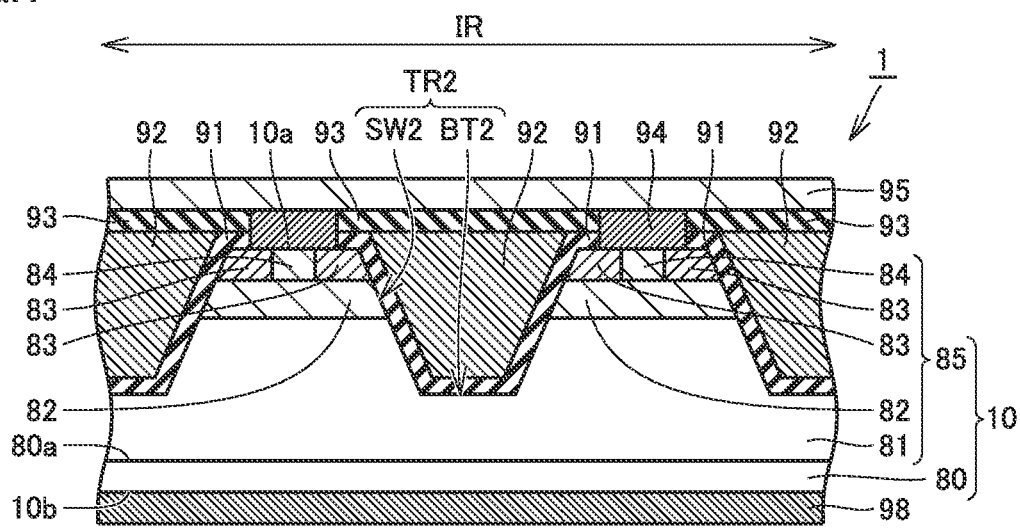
FIG. 1 is a schematic cross sectional view schematically showing a structure of a silicon carbide semiconductor device in a first embodiment of the present invention.

Description of Embodiments of the Invention of the Present Application

Hereinafter, embodiments of the present invention will be described with reference to the drawings. It should be noted that, in the below-mentioned drawings, the same or corresponding portions are given the same reference characters and are not described repeatedly. Further, regarding crystallographic indications in the present specification, an individual orientation is represented by [ ], a group orientation is represented by < >, an individual plane is represented by ( ) and a group plane is represented by { }. In addition, a negative crystallographic index is normally expressed by putting "-" (bar) above a numeral, but is expressed by putting the negative sign before the numeral in the present specification.

(1) A method for manufacturing a silicon carbide semiconductor device 1 in accordance with the embodiment includes steps of preparing a silicon carbide substrate 10 having a first main surface 10a and a second main surface 10b opposite to first main surface 10a, forming a groove portion TR1 in first main surface 10a of silicon carbide substrate 10, and cutting silicon carbide substrate 10 at groove portion TR1. The step of forming groove portion TR1 includes a step of thermally etching the silicon carbide substrate using chlorine.

According to the method for manufacturing silicon carbide semiconductor device 1 in accordance with the embodiment, the step of forming groove portion TR1 includes the step of thermally etching silicon carbide substrate 10 using chlorine. Thereby, groove portion TR1 in which damage to a wall surface is suppressed can be formed. Accordingly, when silicon carbide substrate 10 is cut, occurrence of damage such as chipping or a crack to a chip can be suppressed.

(2) Preferably, in the method for manufacturing silicon carbide semiconductor device 1 in accordance with (1) described above, the step of forming groove portion TR1 includes a step of forming a recessed portion TQ1 in first main surface 10a of silicon carbide substrate 10 by anisotropic etching, before the step of thermally etching silicon carbide substrate 10. Thereby, damage generated in a wall surface forming recessed portion TQ1 by the anisotropic etching can be effectively removed by the thermal etching.

(3) Preferably, in the method for manufacturing silicon carbide semiconductor device 1 in accordance with (2) described above, the step of forming groove portion TR1 includes a step of performing activation annealing on silicon carbide substrate 10, after forming recessed portion TQ1 in first main surface 10a of silicon carbide substrate 10 and before the step of thermally etching silicon carbide substrate 10. Thereby, even when the activation annealing causes surface roughness in silicon carbide substrate 10, the surface roughness can be improved by the thermal etching.

(4) Preferably, in the method for manufacturing silicon carbide semiconductor device 1 in accordance with any of (1) to (3) described above, the method further includes a step of forming a silicon dioxide layer 30 in contact with a sidewall surface SW1 and a bottom portion BT1 which form groove portion TR1, after the step of forming groove portion TR1 in first main surface 10a of silicon carbide substrate 10 and before the step of cutting silicon carbide substrate 10 at groove portion TR1. Thereby, insulating property of silicon carbide semiconductor device 1 can be ensured.

(5) Preferably, in the method for manufacturing silicon carbide semiconductor device 1 in accordance with any of (1) to (4) described above, silicon carbide semiconductor device 1 is a MOSFET having a gate trench TR2. Thereby, occurrence of damage such as chipping or a crack to a chip which includes MOSFET 1 having gate trench TR2 can be suppressed.

(6) Preferably, in the method for manufacturing silicon carbide semiconductor device 1 in accordance with (5) described above, the step of thermally etching silicon carbide substrate 10 is performed simultaneously with a step of forming gate trench TR2. Thereby, gate trench TR2 and groove portion TR1 can be formed simultaneously, and thus the manufacturing process of silicon carbide semiconductor device 1 is simplified.

Details of Embodiments of the Invention of the Present Application

First Embodiment

Figure 2:
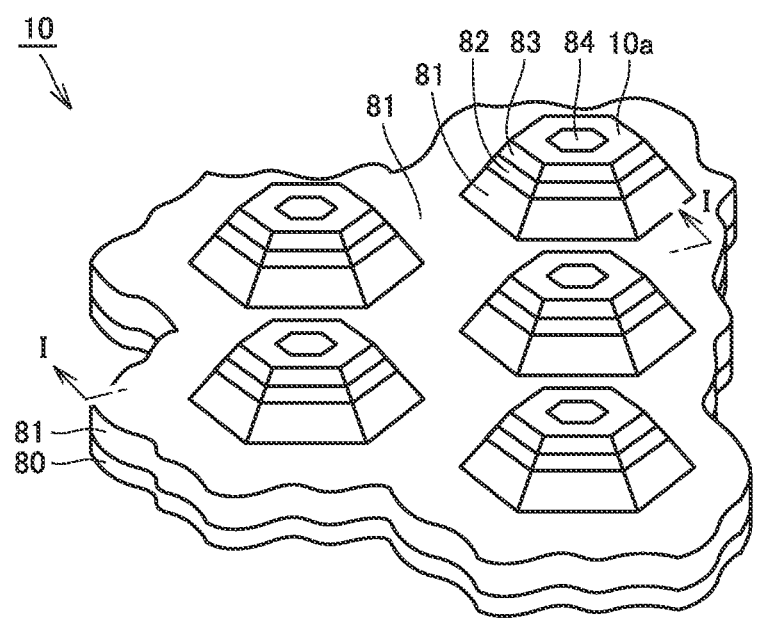
FIG. 2 is a schematic perspective view schematically showing a shape of a silicon carbide substrate of the silicon carbide semiconductor device in the first embodiment of the present invention.

Referring to FIGS. 1 and 2, a structure of MOSFET 1 as an example of a silicon carbide semiconductor device in accordance with a first embodiment will be described.

MOSFET 1 in accordance with the first embodiment mainly has silicon carbide substrate 10, a gate insulating film 91, a gate electrode 92, an interlayer insulating film 93, a source electrode 94, a source interconnection layer 95, and a drain electrode 98. Silicon carbide substrate 10 has first main surface 10a and second main surface 10b opposite to first main surface 10a, and mainly has a silicon carbide single crystal substrate 80 and a silicon carbide epitaxial layer 85. Silicon carbide epitaxial layer 85 mainly has an n type drift region 81, a p type body region 82, an n type source region 83, and a p type contact region 84.

Silicon carbide single crystal substrate 80 is made of, for example, hexagonal silicon carbide, and has a polytype of 4H. Silicon carbide single crystal substrate 80 has, for example, n type (a first conductivity type). Silicon carbide epitaxial layer 85 is provided on silicon carbide single crystal substrate 80. Silicon carbide epitaxial layer 85 has a thickness of, for example, approximately 12 μm. N type drift region 81 has n type. Preferably, the impurity concentration in n type drift region 81 is lower than the impurity concentration in silicon carbide single crystal substrate 80. The donor concentration in n type drift region 81 is preferably more than or equal to $1\times10^{15}$ cm$^{-3}$ and less than or equal to $5\times10^{16}$ cm$^{-3}$, and is $7\times10^{15}$ cm$^{-3}$, for example.

P type body region 82 has p type (a second conductivity type). P type body region 82 is provided on n type drift region 81. The impurity concentration in p type body region 82 is $1\times10^{18}$ cm$^{-3}$, for example. N type source region 83 has n type. N type source region 83 is provided on p type body region 82 to be separated from n type drift region 81 by p type body region 82. P type contact region 84 has p type. P type contact region 84 is connected to n type source region 83 and p type body region 82.

Gate trench TR2 is provided in first main surface 10a of silicon carbide substrate 10. Gate trench TR2 has a second sidewall surface SW2 and a second bottom portion BT2. Second sidewall surface SW2 penetrates n type source region 83 and p type body region 82, and reaches n type drift region 81. On p type body region 82, second sidewall surface SW2 includes a channel surface of MOSFET 1.

Second sidewall surface SW2 is inclined with respect to first main surface 10a of silicon carbide substrate 10, and gate trench TR2 spreads in a tapered manner toward an opening. Preferably, the plane orientation of second sidewall surface SW2 is inclined with respect to a (000-1) plane by more than or equal to 50° and less than or equal to 65°. Second bottom portion BT2 is located on n type drift region 81. In the present embodiment, second bottom portion BT2 is a surface which is substantially parallel to first main surface 10a of silicon carbide substrate 10.

Gate insulating film 91 covers each of second sidewall surface SW2 and second bottom portion BT2 of gate trench TR2. Gate electrode 92 is provided on gate insulating film 91. Source electrode 94 is in contact with each of n type source region 83 and p type contact region 84. Source interconnection layer 95 is in contact with source electrode 94. Source interconnection layer 95 is, for example, an aluminum layer. Interlayer insulating film 93 insulates gate electrode 92 from source interconnection layer 95. Drain electrode 98 is provided in contact with second main surface 10b of silicon carbide substrate 10.

Figure 3:
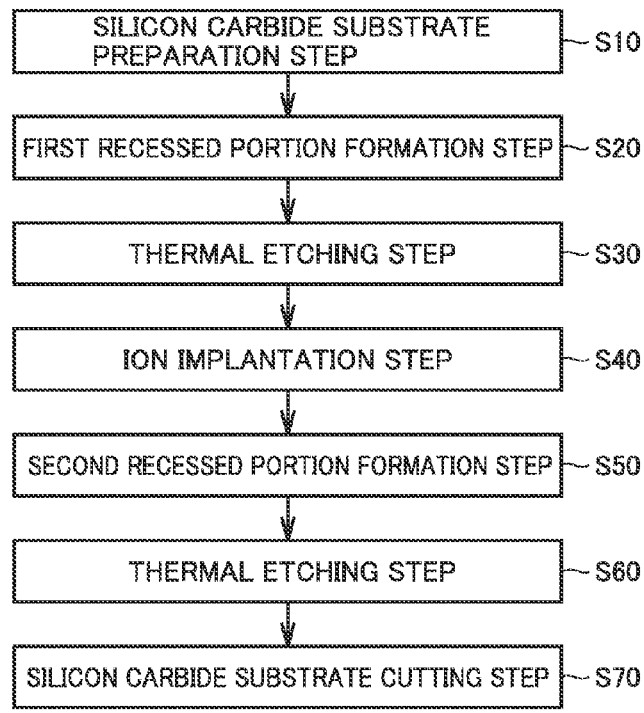
FIG. 3 is a flowchart schematically showing a method for manufacturing the silicon carbide semiconductor device in the first embodiment of the present invention.

Next, a method for manufacturing MOSFET 1 in accordance with the first embodiment will be described with reference to FIG. 3.

First, a silicon carbide substrate preparation step (S10: FIG. 3) is performed. Silicon carbide single crystal substrate 80 having n type conductivity type is prepared by slicing an ingot made of, for example, hexagonal silicon carbide having a polytype of 4H formed by a sublimation method. Next, silicon carbide epitaxial layer 85 is formed on silicon carbide single crystal substrate 80, for example, by a CVD (Chemical Vapor Deposition) method. For example, nitrogen (N) is introduced as an impurity into silicon carbide epitaxial layer 85. Thus, silicon carbide substrate 10 having first main surface 10a and second main surface 10b opposite to the first main surface is prepared (see FIG. 4).

Next, a mask layer 20 having an opening is formed on first main surface 10a of silicon carbide substrate 10, by a photolithographic method. As mask layer 40, for example, a silicon oxide film or the like can be used. The opening is formed corresponding to a position where a dicing line DL (see FIG. 8) is to be formed.

Next, groove portion TR1 is formed in first main surface 10a of silicon carbide substrate 10. The step of forming groove portion TR1 may have a first recessed portion formation step (S20: FIG. 3) and a thermal etching step (S30: FIG. 3).

In the first recessed portion formation step (S20: FIG. 3), plasma etching is performed on silicon carbide substrate 10 having mask layer 20 formed thereon, and thereby a portion of silicon carbide epitaxial layer 85 is removed, and a first recessed portion TQ1 is formed in first main surface 10a of silicon carbide substrate 10. As a method for the etching, for example, dry etching, and more specifically, inductively-coupled-plasma reactive ion etching (ICP-RIE) can be used.

Figure 5:
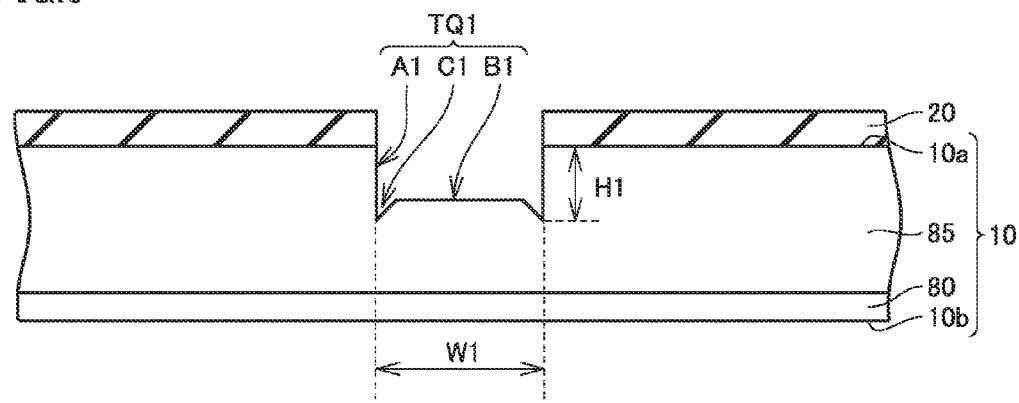
FIG. 5 is a schematic cross sectional view schematically showing a second step of the method for manufacturing the silicon carbide semiconductor device in the first embodiment of the present invention.

Referring to FIG. 5, by performing ICP-RIE on first main surface 10a of silicon carbide substrate 10 using SF$_6$ or a mixed gas of SF$_6$ and O$_2$ as a reactive gas, for example, first recessed portion TQ1 is formed in a region where dicing line DL (FIG. 8) is to be formed, first recessed portion TQ1 having a first sidewall surface A1 substantially along a thickness direction of silicon carbide substrate 10 (a vertical direction in the drawing), a first bottom portion B1 substantially parallel to first main surface 10a of silicon carbide substrate 10, and a sub trench C1 which connects first sidewall surface A1 and first bottom portion B1, and extends in a direction intersecting with both first sidewall surface A1 and first bottom portion B1. A width W1 of first recessed portion TQ1 is, for example, more than or equal to approximately 50 μm and less than or equal to approximately 150 μm. A depth H1 of first recessed portion TQ1 is, for example, more than or equal to approximately 0.1 μm and less than or equal to approximately 0.8 μm, and is preferably more than or equal to approximately 0.2 μm and less than or equal to approximately 0.5 μm.

Next, the thermal etching step (S20: FIG. 3) is performed. Specifically, thermal etching using chlorine is performed on first recessed portion TQ1 formed in silicon carbide substrate 10. In the thermal etching step, first sidewall surface A1, first bottom portion B1, and sub trench C1 of first recessed portion TQ1 in silicon carbide substrate 10 are thermally etched within a furnace, while supplying a gas containing chlorine into the furnace. More specifically, silicon carbide substrate 10 is heated within the furnace, for example at more than or equal to 800° C. and less than or equal to 1300° C. for approximately 20 minutes. The temperature for the thermal etching of silicon carbide substrate 10 is preferably more than or equal to 800° C., and more preferably less than or equal to 1300° C. It should be noted that mask layer 20 made of silicon dioxide is not substantially etched during the thermal etching of silicon carbide, because it has an extremely high selectivity with respect to silicon carbide.

Figure 6:
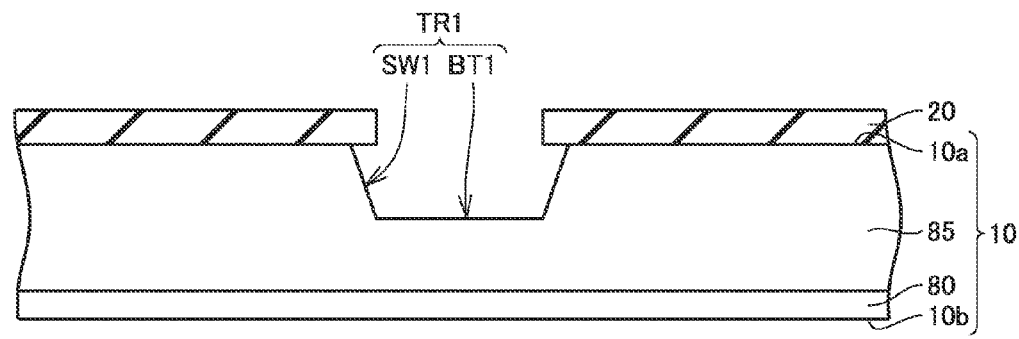
FIG. 6 is a schematic cross sectional view schematically showing a third step of the method for manufacturing the silicon carbide semiconductor device in the first embodiment of the present invention.

By performing the thermal etching step described above, first sidewall surface A1, first bottom portion B1, and sub trench C1 of first recessed portion TQ1 are etched by more than or equal to approximately 2 nm and approximately 0.1 μm, for example, and thereby groove portion TR1 formed of a first sidewall surface SW1 and a first bottom portion BT1 connected to first sidewall surface SW1 is formed on silicon carbide substrate 10, as shown in FIG. 6. Next, mask layer 20 is removed by any method such as etching (see FIG. 7).

Figure 7:
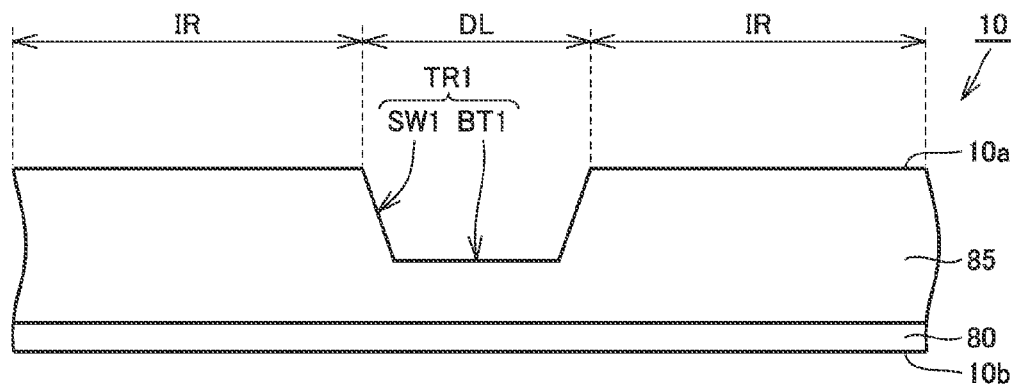
FIG. 7 is a schematic cross sectional view schematically showing a fourth step of the method for manufacturing the silicon carbide semiconductor device in the first embodiment of the present invention.
Figure 8:
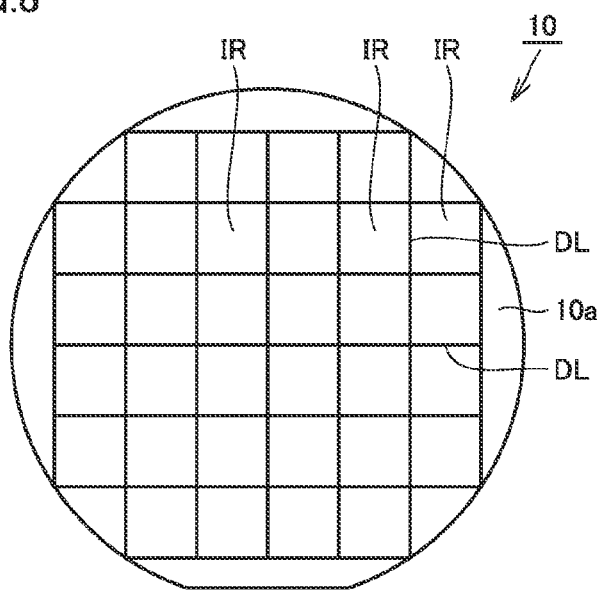
FIG. 8 is a schematic plan view schematically showing the fourth step of the method for manufacturing the silicon carbide semiconductor device in the first embodiment of the present invention.

Referring to FIGS. 7 and 8, groove portion TR1 formed in first main surface 10a of silicon carbide substrate 10 forms dicing line DL. As shown in FIG. 8, dicing lines DL are formed in a grid pattern to cross first main surface 10a of silicon carbide substrate 10 in a lengthwise direction and a lateral direction. Each dicing line DL corresponds to a cutting position in the step of cutting silicon carbide substrate 10 described later. A region surrounded by dicing lines DL is an element region IR, and a semiconductor element such as MOSFET 1 is formed in element region IR.

Figure 19:
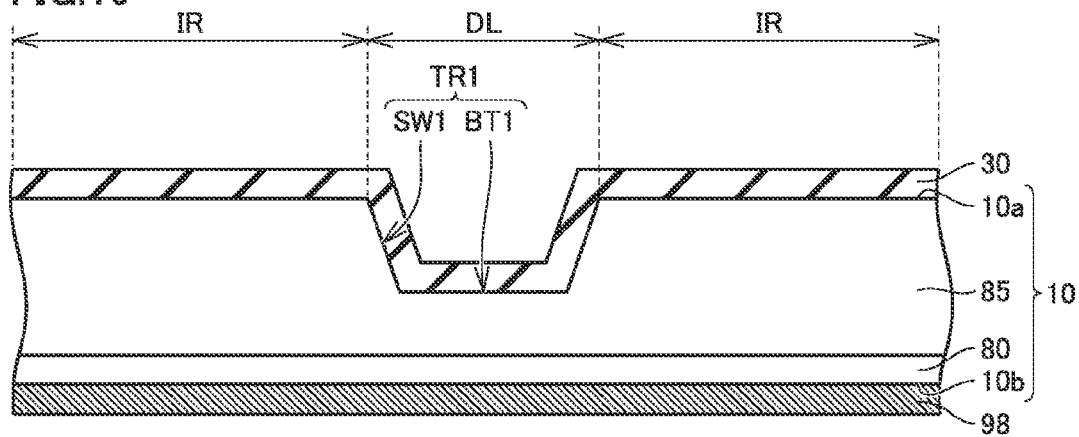
FIG. 19 is a schematic cross sectional view schematically showing a fifteenth step of the method for manufacturing the silicon carbide semiconductor device in the first embodiment of the present invention.

As shown in FIG. 19, silicon dioxide layer 30 may be formed to cover first sidewall surface SW1 and first bottom portion BT1 which form groove portion TR1. Preferably, formation of silicon dioxide layer 30 covering first sidewall surface SW1 and first bottom portion BT1 which form groove portion TR1 is performed before a thermal etching step (S60: FIG. 3) in the step of forming gate trench TR2 described later.

Figure 9:
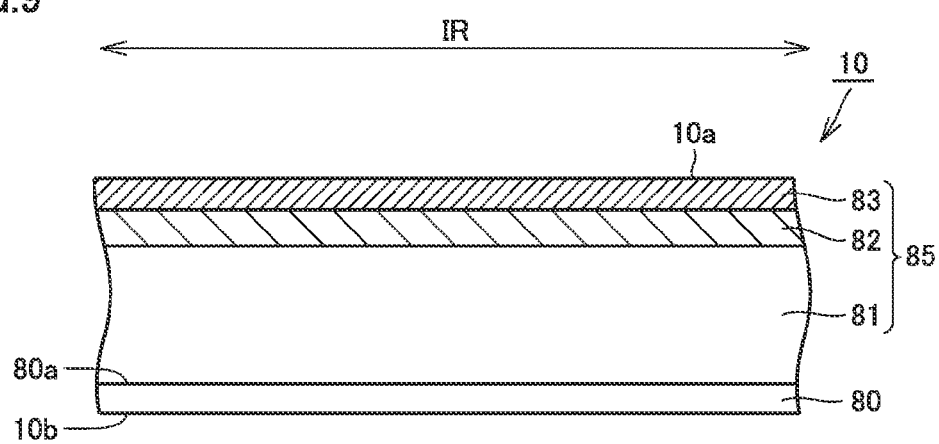
FIG. 9 is a schematic cross sectional view schematically showing a fifth step of the method for manufacturing the silicon carbide semiconductor device in the first embodiment of the present invention.

Next, an ion implantation step (S40: FIG. 3) is performed. Referring to FIG. 9, ion implantation is performed on first main surface 10a of silicon carbide substrate 10. Specifically, for forming p type body region 82, ions of an impurity for imparting p type, for example such as aluminum (Al), are implanted into first main surface 10a of silicon carbide substrate 10. Further, in the ion implantation for forming n type source region 83, ions of an impurity for imparting n type, for example such as phosphorus (P), are implanted. Thereby, p type body region 82 and n type source region 83 are formed. A portion of silicon carbide epitaxial layer 85 in which p type body region 82 and n type source region 83 are not formed serves as n type drift region 81. It should be noted that, instead of ion implantation, epitaxial growth accompanied by addition of impurities may be used.

Figure 10:
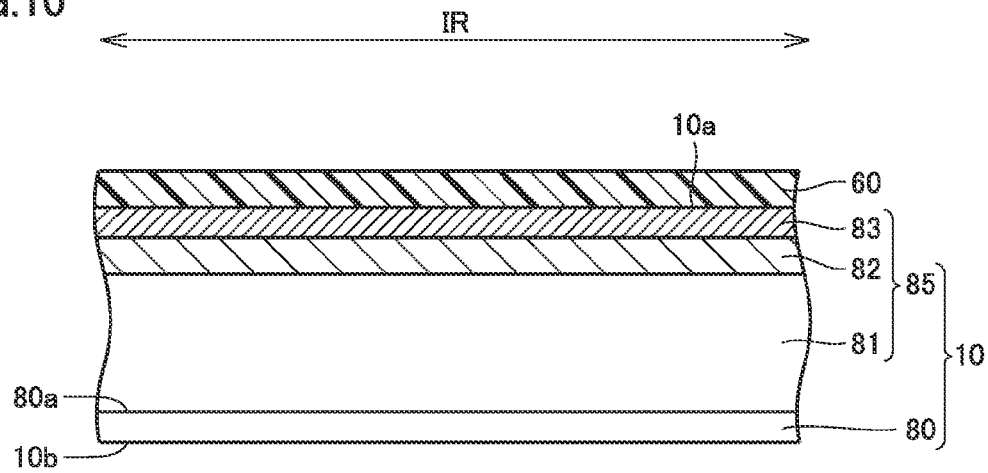
FIG. 10 is a schematic cross sectional view schematically showing a sixth step of the method for manufacturing the silicon carbide semiconductor device in the first embodiment of the present invention.
Figure 11:
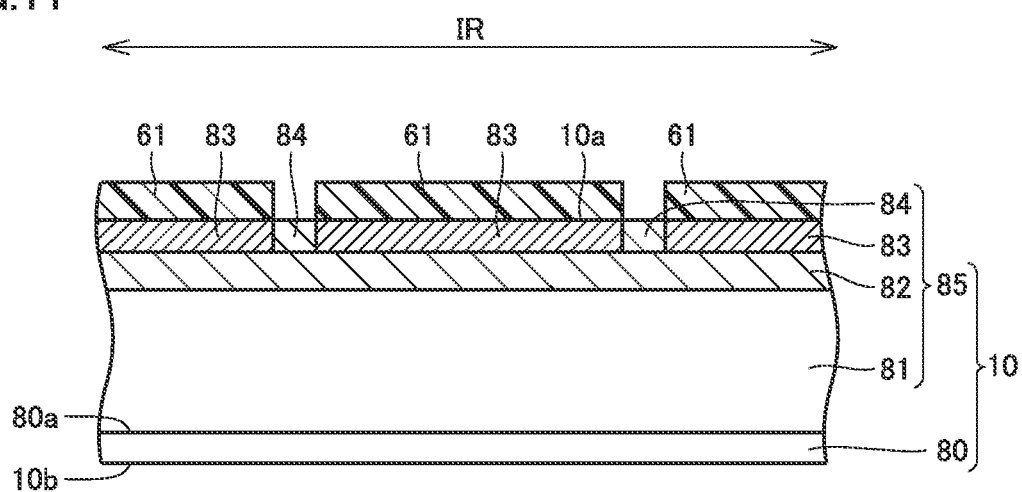
FIG. 11 is a schematic cross sectional view schematically showing a seventh step of the method for manufacturing the silicon carbide semiconductor device in the first embodiment of the present invention.
Figure 12:
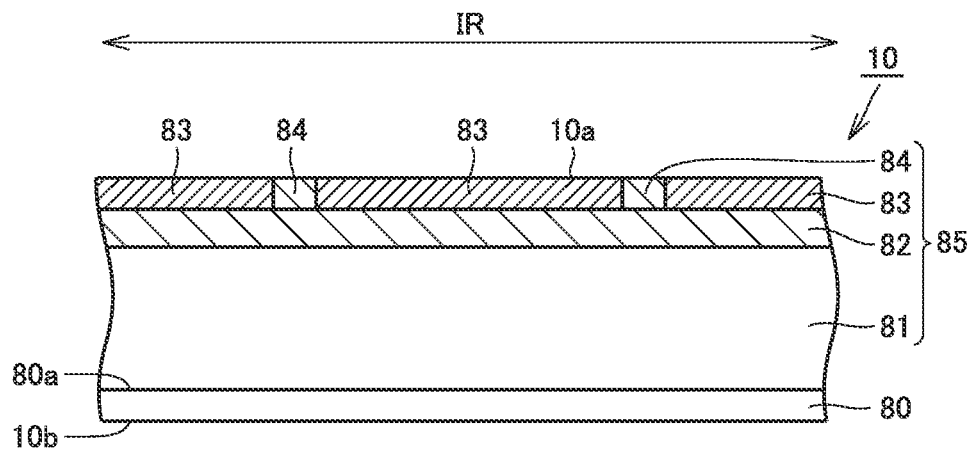
FIG. 12 is a schematic cross sectional view schematically showing an eighth step of the method for manufacturing the silicon carbide semiconductor device in the first embodiment of the present invention.

Referring to FIG. 10, a resist film 60 is formed on n type source region 83 of silicon carbide substrate 10. Exposure and development are performed on resist film 60. Thereby, a mask layer 61 (FIG. 11) having an opening corresponding to a position where p type contact region 84 is to be formed is formed. Next, p type contact region 84 is formed by ion implantation using mask layer 61. Next, mask layer 61 is removed (FIG. 12). Thus, p type contact region 84 which connects first main surface 10a of silicon carbide substrate 10 and p type body region 82 is formed by the photolithographic method.

Next, an activation annealing step is performed on silicon carbide substrate 10 to activate the impurities which have been introduced in silicon carbide epitaxial layer 85 by the above ion implantation step. The temperature for the activation annealing step is preferably more than or equal to 1500° C. and less than or equal to 1900° C., and is approximately 1700° C., for example. The time for heat treatment is approximately 30 minutes, for example. The atmosphere for the heat treatment is preferably an inert gas atmosphere, and is an Ar atmosphere, for example.

Figure 13:
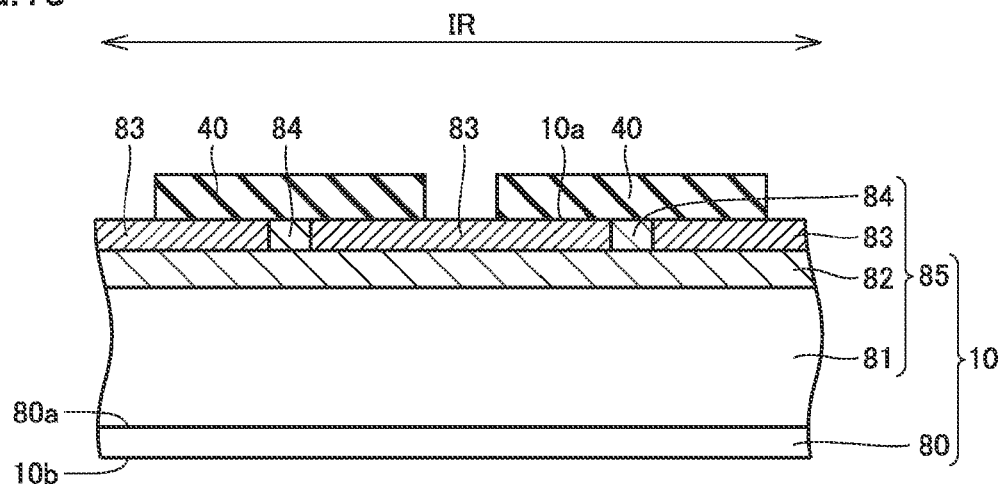
FIG. 13 is a schematic cross sectional view schematically showing a ninth step of the method for manufacturing the silicon carbide semiconductor device in the first embodiment of the present invention.

Next, a second recessed portion formation step (S50: FIG. 3) is performed. Referring to FIG. 13, a mask layer 40 having an opening is formed on a surface made of n type source region 83 and p type contact region 84, by the photolithographic method. As mask layer 40, for example, a silicon oxide film or the like can be used. The opening is formed corresponding to a position where gate trench TR2 (FIG. 1) is to be formed. Referring to FIG. 13, plasma etching is performed on silicon carbide substrate 10 having mask layer 40 formed thereon, and thereby a second recessed portion TQ2 is formed in first main surface 10a of silicon carbide substrate 10. Second recessed portion TQ2 is formed by removing portions of n type source region 83, p type body region 82, and n type drift region 81 of silicon carbide substrate 10, by etching, through the opening in mask layer 40. As a method for the etching, for example, dry etching, and more specifically, inductively-coupled-plasma reactive ion etching (ICP-RIE) can be used. By performing ICP-RIE on first main surface 10a of silicon carbide substrate 10 using $SF_6$ or a mixed gas of $SF_6$ and $O_2$ as a reactive gas, for example, second recessed portion TQ2 is formed in a region where gate trench TR2 (FIG. 1) is to be formed, second recessed portion TQ2 having a second sidewall surface A2 substantially along the thickness direction of silicon carbide substrate 10 (the vertical direction in the drawing), and a second bottom portion B2 substantially parallel to first main surface 10a. A width W2 of second recessed portion TQ2 is, for example, more than or equal to approximately 0.5 μm and less than or equal to approximately 3 μm, and a depth H2 of second recessed portion TQ2 is, for example, more than or equal to approximately 0.1 μm and less than or equal to approximately 1 μm. Width W2 of second recessed portion TQ2 is smaller than width W1 of first recessed portion TQ1 (see FIG. 5) described above. Further, depth H2 of second recessed portion TQ2 may be smaller than depth H1 of first recessed portion TQ1 (see FIG. 5) described above.

Next, the thermal etching step (S60: FIG. 3) is performed. Specifically, thermal etching is performed on second recessed portion TQ2 formed in first main surface 10a of silicon carbide substrate 10. In the thermal etching step, second sidewall surface A2 and second bottom portion BT2 of second recessed portion TQ2 formed in first main surface 10a of silicon carbide substrate 10 are thermally etched within the furnace, while supplying a gas containing chlorine into the furnace. Silicon carbide substrate 10 is heated within the furnace, for example at more than or equal to 800° C. and less than or equal to 1300° C. for approximately 20 minutes. The temperature for the thermal etching of silicon carbide substrate 10 is preferably more than or equal to 800° C., and more preferably less than or equal to 1300° C. By heating silicon carbide substrate 10 at more than or equal to 800° C. and less than or equal to 1300° C. for approximately 20 minutes, second sidewall surface A2 and second bottom portion B2 of second recessed portion TQ2 are etched. The temperature for the thermal etching of silicon carbide substrate 10 is preferably more than or equal to 800° C., and more preferably less than or equal to 1300° C. It should be noted that mask layer 40 made of silicon dioxide is not substantially etched during the thermal etching of silicon carbide, because it has an extremely high selectivity with respect to silicon carbide.

Figure 15:
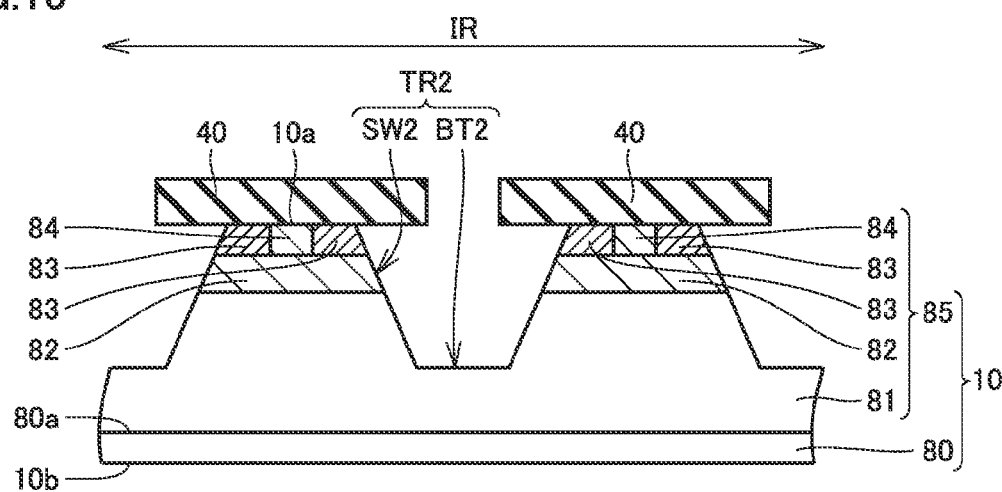
FIG. 15 is a schematic cross sectional view schematically showing an eleventh step of the method for manufacturing the silicon carbide semiconductor device in the first embodiment of the present invention.

By performing the thermal etching step described above, second sidewall surface A2 and second bottom portion B2 of second recessed portion TQ2 are etched by more than or equal to approximately 2 nm and approximately 0.1 μm, for example, and thereby gate trench TR2 formed of a second sidewall surface SW2 and a second bottom portion BT2 is formed on first main surface 10a of silicon carbide substrate 10, as shown in FIG. 15. Next, mask layer 40 is removed by any method such as etching. Second bottom portion BT2 may be a surface, or may be a line. When second bottom portion BT2 is a line, gate trench TR2 has a V shape when viewed in a cross section (field of view seen in a direction parallel to first main surface 10a of silicon carbide substrate 10).

Figure 16:
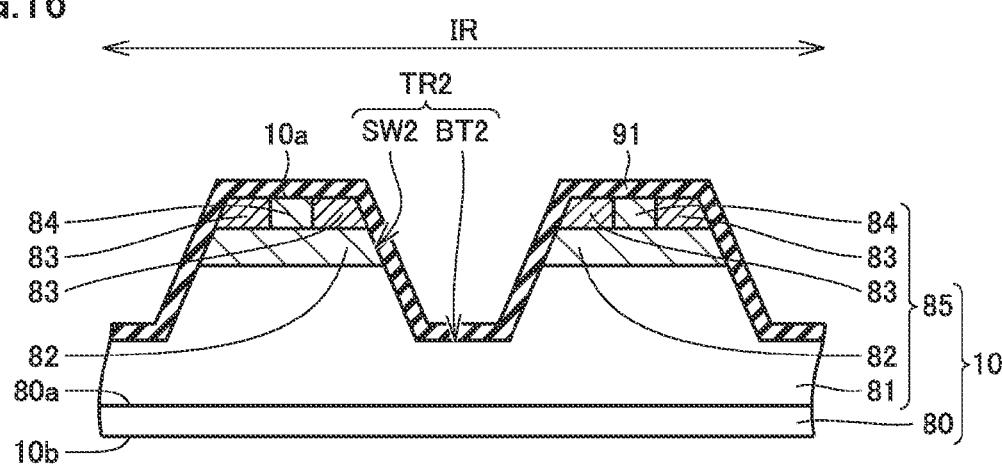
FIG. 16 is a schematic cross sectional view schematically showing a twelfth step of the method for manufacturing the silicon carbide semiconductor device in the first embodiment of the present invention.

Next, a gate insulating film formation step is performed. Specifically, referring to FIG. 16, gate insulating film 91 is formed in contact with second sidewall surface SW2 and second bottom portion BT2 of gate trench TR2. Thereby, gate insulating film 91, which covers each of second sidewall surface SW2 and second bottom portion BT2 of gate trench TR2 and is contact with n type drift region 81, p type body region 82, n type source region 83, and p type contact region 84, is formed. Gate insulating film 91 is made of silicon dioxide, and can be formed, for example, by thermal oxidation.

After gate insulating film 91 is formed, NO annealing using nitric oxide (NO) gas as an atmospheric gas may be performed. Specifically, for example, silicon carbide substrate 10 having gate insulating film 91 formed thereon is held in a nitric oxide atmosphere, at a temperature of more than or equal to 1100° C. and less than or equal to 1300° C., for approximately one hour. Thereby, nitrogen atoms are introduced into an interface region between gate insulating film 91 and p type body region 82. As a result, formation of an interface state in the interface region is suppressed, and thus channel mobility can be improved. It should be noted that a gas other than NO gas may be used as an atmospheric gas, if the gas allows such introduction of nitrogen atoms.

After the NO annealing, Ar annealing using argon (Ar) as an atmospheric gas may be further performed. Preferably, the heating temperature for the Ar annealing is higher than the heating temperature for the NO annealing, and is lower than the melting point of gate insulating film 91. This heating temperature is held for approximately one hour, for example. Thereby, formation of the interface state in the interface region between gate insulating film 91 and p type body region 82 is further suppressed. It should be noted that, as an atmospheric gas, another inert gas such as nitrogen gas may be used instead of Ar gas.

Figure 17:
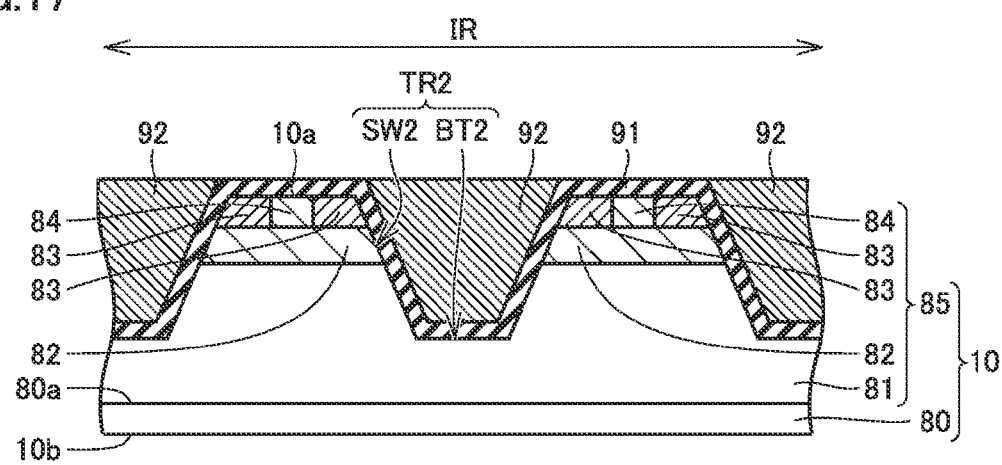
FIG. 17 is a schematic cross sectional view schematically showing a thirteenth step of the method for manufacturing the silicon carbide semiconductor device in the first embodiment of the present invention.

Next, a front surface electrode formation step is performed. In the front surface electrode formation step, gate electrode 92 and source electrode 94 are formed. Specifically, referring to FIG. 17, gate electrode 92 is formed on gate insulating film 91. Specifically, gate electrode 92 is formed on gate insulating film 91 to fill a region inside gate trench TR2, with gate insulating film 91 being interposed therebetween. Gate electrode 92 can be formed, for example, by formation of a film of a conductor or doped polysilicon and CMP (Chemical Mechanical Polishing).

Figure 18:
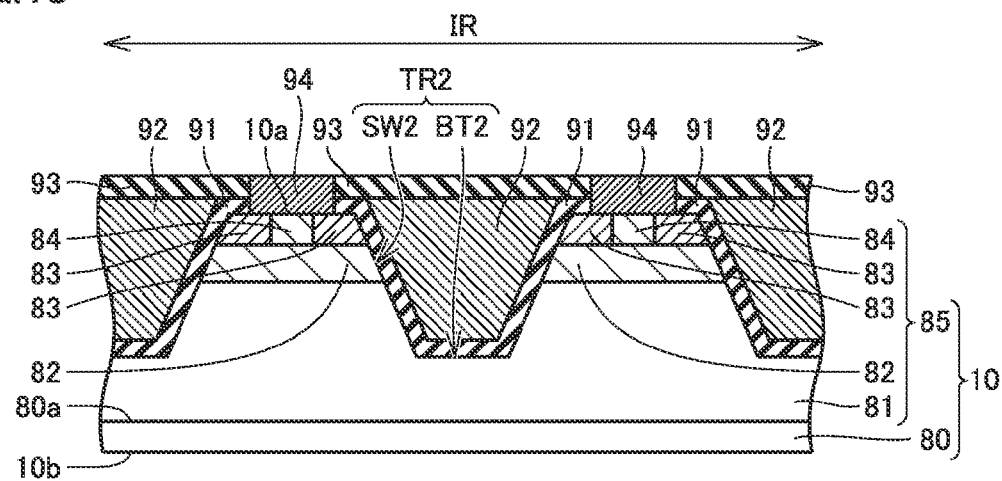
FIG. 18 is a schematic cross sectional view schematically showing a fourteenth step of the method for manufacturing the silicon carbide semiconductor device in the first embodiment of the present invention.

Next, referring to FIG. 18, interlayer insulating film 93 is formed on gate electrode 92 and gate insulating film 91 to cover an exposed surface of gate electrode 92. Next, etching is performed such that an opening is formed in interlayer insulating film 93 and gate insulating film 91. Through this opening, each of n type source region 83 and p type contact region 84 is exposed on first main surface 10a. Next, source electrode 94 which is in contact with each of n type source region 83 and p type contact region 84 is formed on first main surface 10a. Specifically, a metal film containing Ti, Al, and Si, for example, is formed in contact with each of n type source region 83 and p type contact region 84, by sputtering. Next, by heating silicon carbide substrate 10 having the metal film formed thereon, the metal film is alloyed, and thus source electrode 94 which is in ohmic contact with silicon carbide substrate 10 is formed.

Next, a back surface electrode formation step is performed. Specifically, drain electrode 98 is formed on second main surface 10b of silicon carbide substrate 10. The material used for drain electrode 98 may be the same as the material for the source electrode described above.

Figure 20:
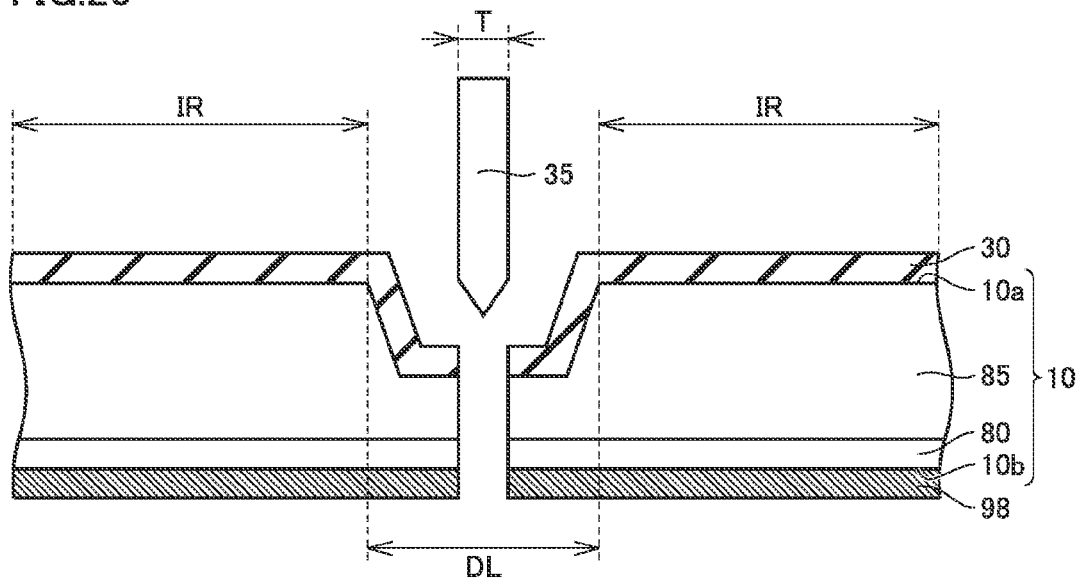
FIG. 20 is a schematic cross sectional view schematically showing a sixteenth step of the method for manufacturing the silicon carbide semiconductor device in the first embodiment of the present invention.

Next, a silicon carbide substrate cutting step (S70: FIG. 3) is performed. Referring to FIG. 20, a dicing blade 35 having a diamond cutting edge, for example, is arranged above first bottom portion BT1 of groove portion TR1. By moving or rotating dicing blade 35 in the thickness direction of silicon carbide substrate 10, silicon carbide substrate 10 is cut along dicing line DL. Thereby, silicon carbide substrate 10 is divided into a plurality of chips each separated. It should be noted that the thickness of the cutting edge of dicing blade 35 is, for example, more than or equal to approximately 10 μm and less than or equal to approximately 100 μm. Silicon carbide substrate 10 may be cut by a method other than a dicing blade method using a dicing blade. Silicon carbide substrate 10 may be cut, for example, by an ultrasonic dancing method, a laser dicing method, or the like.

Figure 22:
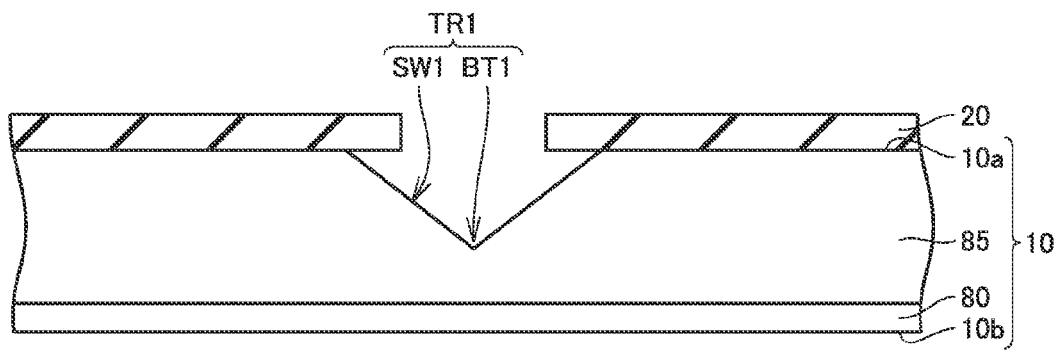
FIG. 22 is a schematic cross sectional view schematically showing a variation of the third step of the method for manufacturing the silicon carbide semiconductor device in the first embodiment of the present invention.

It should be noted that, although the first embodiment has described a case where the step of forming groove portion TR1 in first main surface 10a of silicon carbide substrate 10 includes the first recessed portion formation step (S20: FIG. 3) and the thermal etching step (S30: FIG. 3), the step of forming groove portion TR1 does not have to have the first recessed portion formation step (S20: FIG. 3). When the step of forming groove portion TR1 does not have the first recessed portion formation step, groove portion TR1 may be formed as described below. For example, mask layer 20 having an opening is formed on first main surface 10a of silicon carbide substrate 10. Thereafter, referring to FIG. 22, the thermal etching step (S30: FIG. 3) is performed on silicon carbide substrate 10, using mask layer 20. As shown in FIG. 22, groove portion TR1 formed in first main surface 10a of silicon carbide substrate 10 is formed of first sidewall surface SW1 and first bottom portion BT1, and first bottom portion BT1 is a line, instead of a surface. That is, when viewed in a cross section, groove portion TR1 has a V shape.

Next, the function and effect of the method for manufacturing MOSFET 1 in accordance with the first embodiment will be described.

According to the method for manufacturing silicon carbide semiconductor device 1 in accordance with the first embodiment, the step of forming groove portion TR1 includes the step of thermally etching silicon carbide substrate 10 using chlorine. Thereby, groove portion TR1 in which damage to first sidewall surface SW1 and first bottom portion BT1 is suppressed can be formed. Accordingly, when silicon carbide substrate 10 is cut, occurrence of damage such as chipping or a crack to a chip can be suppressed.

Further, according to the method for manufacturing MOSFET 1 in accordance with the first embodiment, the step of forming groove portion TR1 includes the step of forming first recessed portion TQ1 in first main surface 10a of silicon carbide substrate 10 by anisotropic etching, before the step of thermally etching silicon carbide substrate 10. Thereby, damage such as sub trench C1 generated in first recessed portion TQ1 by the anisotropic etching can be effectively removed by the thermal etching.

Furthermore, according to the method for manufacturing MOSFET 1 in accordance with the first embodiment, the method further includes the step of forming silicon dioxide layer 30 in contact with first sidewall surface SW1 and first bottom portion BT1 which form groove portion TR1, after the step of forming groove portion TR1 in first main surface 10a of silicon carbide substrate 10 and before the step of cutting silicon carbide substrate 10 at groove portion TR1. Thereby, insulating property of MOSFET 1 can be ensured.

Furthermore, according to the method for manufacturing MOSFET 1 in accordance with the first embodiment, MOSFET 1 has gate trench TR2. Thereby, occurrence of damage such as chipping or a crack to a chip which includes MOSFET 1 having gate trench TR2 can be suppressed.

Second Embodiment

Figure 21:
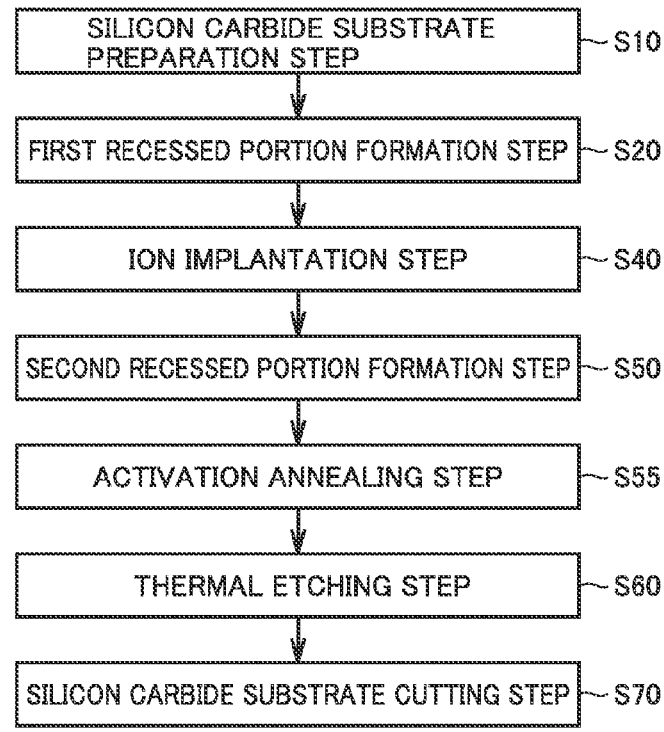
FIG. 21 is a flowchart schematically showing a method for manufacturing a silicon carbide semiconductor device in a second embodiment of the present invention.

Next, a method for manufacturing MOSFET 1 in accordance with a second embodiment will be described with reference to FIG. 21. The method for manufacturing MOSFET 1 in accordance with the second embodiment is different from the method for manufacturing MOSFET 1 in accordance with the first embodiment in that the thermal etching on first recessed portion TQ1 and the thermal etching on second recessed portion TQ2 are performed simultaneously, and that activation annealing is performed on silicon carbide substrate 10 after the step of forming first recessed portion TQ1 and before the step of thermally etching silicon carbide substrate 10. Other than those points, the method for manufacturing MOSFET 1 in accordance with the second embodiment is substantially the same as the method for manufacturing MOSFET 1 in accordance with the first embodiment. Hereinafter, a description will be given focusing on the difference from the method for manufacturing MOSFET 1 in accordance with the first embodiment.

Figure 4:
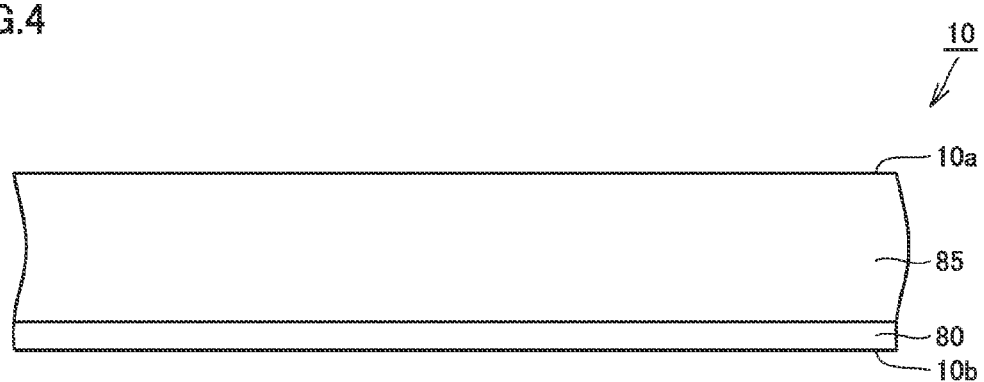
FIG. 4 is a schematic cross sectional view schematically showing a first step of the method for manufacturing the silicon carbide semiconductor device in the first embodiment of the present invention.

First, referring to FIG. 4, a silicon carbide substrate preparation step (S10: FIG. 21) is performed, by the same method as that described in the first embodiment, and thus silicon carbide substrate 10 having first main surface 10a and second main surface 10b opposite to first main surface 10a is prepared. Next, referring to FIG. 5, a first recessed portion formation step (S20: FIG. 21) is performed, by the same method as that described in the first embodiment, and thus first recessed portion TQ1 is formed in first main surface 10a of silicon carbide substrate 10. Thereby, dicing line DL for element isolation is formed as shown in FIG. 8. That is, first recessed portion TQ1 constitutes dicing line DL.

Next, referring to FIGS. 9 to 12, an ion implantation step (S40: FIG. 21) is performed, by the same method as that described in the first embodiment. Thereby, p type body region 82, n type source region 83, and p type contact region 84 are formed in silicon carbide substrate 10.

Figure 14:
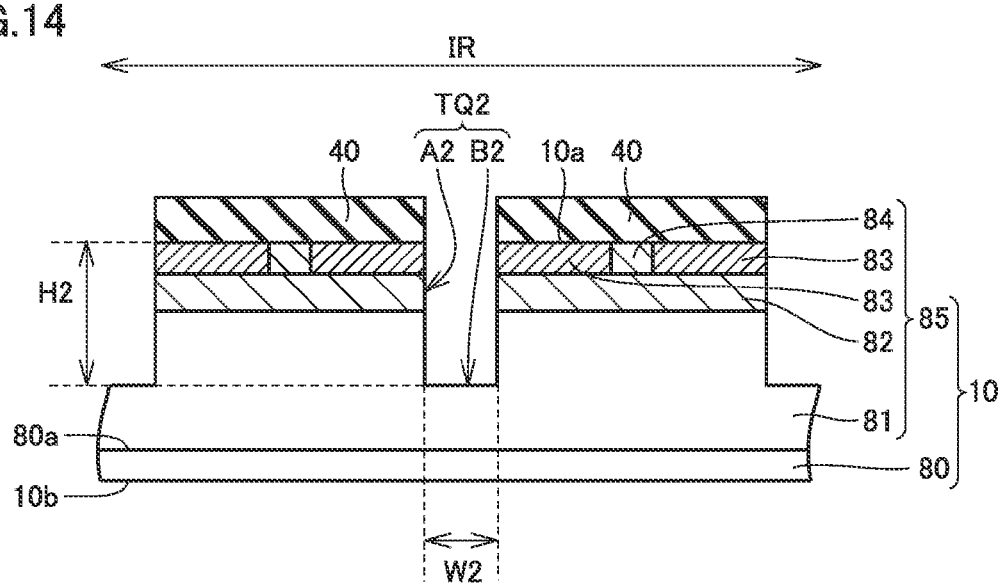
FIG. 14 is a schematic cross sectional view schematically showing a tenth step of the method for manufacturing the silicon carbide semiconductor device in the first embodiment of the present invention.

Next, referring to FIGS. 13 and 14, a second recessed portion formation step (S50: FIG. 21) is performed, by the same method as that described in the first embodiment. Thereby, second recessed portion TQ2 opened in first main surface 10a of silicon carbide substrate 10 is formed in a region where gate trench TR2 is to be formed.

Next, an activation annealing step is performed on silicon carbide substrate 10, by the same method as that described in the first embodiment. The temperature for the activation annealing step is preferably more than or equal to 1500° C. and less than or equal to 1900° C., and is approximately 1700° C., for example. The time for heat treatment is approximately 30 minutes, for example. The atmosphere for the heat treatment is preferably an inert gas atmosphere, and is an Ar atmosphere, for example.

Next, a thermal etching step (S60: FIG. 21) is performed. Specifically, thermal etching using chlorine is performed simultaneously on first sidewall surface A1 and first bottom portion B1 which form first recessed portion TQL as well as on second sidewall surface A2 and second bottom portion B2 which form second recessed portion TQ2, both formed in first main surface 10a of silicon carbide substrate 10. The thermal etching is performed by the same method as that described in the first embodiment. By etching first sidewall surface A1 and first bottom portion B1 which form first recessed portion TQ1 as well as second sidewall surface A2 and second bottom portion B2 which form second recessed portion TQ2 as described above, groove portion TR1 and gate trench TR2 are simultaneously formed in first main surface 10a of silicon carbide substrate 10.

Next, thermal oxidation may be performed on silicon carbide substrate 10. Thereby, gate insulating film 91 (see FIG. 16) in contact with second sidewall surface SW2 and second bottom portion BT2 which form gate trench TR2, and silicon dioxide layer 30 (see FIG. 19) in contact with first sidewall surface SW1 and first bottom portion BT1 which form groove portion TR1, may be formed.

Next, referring to FIG. 20, a silicon carbide substrate cutting step (S70: FIG. 21) is performed, by the same method as that described in the first embodiment. Thereby, silicon carbide substrate 10 is cut along dicing line DL, and thus silicon carbide substrate 10 is divided into a plurality of chips.

According to the method for manufacturing MOSFET 1 in accordance with the second embodiment, the step of forming groove portion TR1 includes the step of performing activation annealing on silicon carbide substrate 10, after forming recessed portion TQ1 in first main surface 10a of silicon carbide substrate 10 and before the step of thermally etching silicon carbide substrate 10. Thereby, even when the activation annealing causes surface roughness in silicon carbide substrate 10, the surface roughness can be improved by the thermal etching.

Further, according to the method for manufacturing silicon carbide semiconductor device 1 in accordance with the second embodiment, the step of thermally etching silicon carbide substrate 10 is performed simultaneously with the step of forming gate trench TR2. Thereby, gate trench TR2 and groove portion TR1 can be formed simultaneously, and thus the manufacturing process of MOSFET 1 is simplified.

It should be noted that, although the first conductivity type has been described as n type and the second conductivity type has been described as p type in each of the embodiments described above, the first conductivity type may be p type and the second conductivity type may be n type. Further, although an MOSFET has been described as an example of the silicon carbide semiconductor device in each of the embodiments described above, the silicon carbide semiconductor device may be an IGBT (Insulated Gate Bipolar Transistor), an SBD (Schottky Barrier Diode), or the like.

It should be understood that the embodiments disclosed herein are illustrative and non-restrictive in every respect. The scope of the present invention is defined by the scope of the claims, rather than the description above, and is intended to include any modifications within the scope and meaning equivalent to the scope of the claims.

REFERENCE SIGNS LIST

1: silicon carbide semiconductor device (MOSFET); 10: silicon carbide substrate; 10a: first main surface; 10b: second main surface; 20, 40, 61: mask layer; 30: silicon dioxide layer; 35: dicing blade; 60: resist film; 80: silicon carbide single crystal substrate; 81: n type drift region; 82: p type body region; 83: n type source region; 84: p type contact region; 85: silicon carbide epitaxial layer; 91: gate insulating film; 92: gate electrode; 93: interlayer insulating film; 94: source electrode; 95: source interconnection layer; 98: drain electrode; A1, SW1: first sidewall surface (sidewall surface); A2, SW2: second sidewall surface; B1, BT1: first bottom portion (bottom portion); B2, BT2: second bottom portion; C1: sub trench; DL: dicing line; H1, H2: depth; IR: element region; TQ1: first recessed portion (recessed portion); TQ2: second recessed portion; TR1: groove portion; TR2: gate trench; W1, W2: width.

The invention claimed is:

1. A method for manufacturing a silicon carbide semiconductor device, comprising the steps of:
preparing a silicon carbide substrate having a first main surface and a second main surface opposite to the first main surface;
forming a groove portion in the first main surface of the silicon carbide substrate; and
cutting the silicon carbide substrate at the groove portion,
wherein the step of forming the groove portion includes a step of thermally etching the silicon carbide substrate using chlorine,
wherein the step of forming the groove portion includes a step of forming a recessed portion in the first main surface of the silicon carbide substrate by anisotropic etching, before the step of thermally etching the silicon carbide substrate.

2. The method for manufacturing the silicon carbide semiconductor device according to claim 1, wherein the step of forming the groove portion includes a step of performing activation annealing on the silicon carbide substrate, after forming the recessed portion in the first main surface of the silicon carbide substrate and before the step of thermally etching the silicon carbide substrate.

3. A method for manufacturing a silicon carbide semiconductor device, comprising the steps of:
preparing a silicon carbide substrate having a first main surface and a second main surface opposite to the first main surface;
forming a groove portion in the first main surface of the silicon carbide substrate;
forming a silicon dioxide layer in contact with a sidewall surface and a bottom portion which form the groove portion; and
cutting the silicon carbide substrate at the groove portion,
wherein the step of forming the groove portion includes a step of thermally etching the silicon carbide substrate using chlorine,
wherein the step of forming the silicon dioxide layer is after the step of forming the groove portion in the first main surface of the silicon carbide substrate and before the step of cutting the silicon carbide substrate at the groove portion.

4. The method for manufacturing the silicon carbide semiconductor device according to claim 1, wherein the silicon carbide semiconductor device is a MOSFET having a gate trench.

5. The method for manufacturing the silicon carbide semiconductor device according to claim 4, wherein the step of thermally etching the silicon carbide substrate is performed simultaneously with a step of forming the gate trench.

6. The method for manufacturing the silicon carbide semiconductor device according to claim 3, wherein the step of forming the groove portion includes a step of forming a recessed portion in the first main surface of the silicon carbide substrate by anisotropic etching, before the step of thermally etching the silicon carbide substrate.

7. The method for manufacturing the silicon carbide semiconductor device according to claim 6, wherein the step of forming the groove portion includes a step of performing activation annealing on the silicon carbide substrate, after forming the recessed portion in the first main surface of the silicon carbide substrate and before the step of thermally etching the silicon carbide substrate.

8. The method for manufacturing the silicon carbide semiconductor device according to claim 3, wherein the silicon carbide semiconductor device is a MOSFET having a gate trench.

9. The method for manufacturing the silicon carbide semiconductor device according to claim 8, wherein the step of thermally etching the silicon carbide substrate is performed simultaneously with a step of forming the gate trench.

* * * * *